United States Patent
Hsu et al.

(10) Patent No.: US 11,778,746 B2
(45) Date of Patent: Oct. 3, 2023

(54) ASSEMBLY STRUCTURE OF TRANSFORMER AND CIRCUIT BOARD AS WELL AS ASSEMBLY METHOD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Tsung-Po Hsu, Taipei (TW); Yung-Chou Li, Taipei (TW); Yu-Jen Wei, Taipei (TW); Chih-Chun Yang, Taipei (TW)

(73) Assignees: LITE-ON ELECTRONICS (GUANGZHOU) LIMITED, Guangzhou (CN); LITE-ON TECHNOLOGY CORPORATION, Taipei (TW)

(*) Notice: Subject to any disclaimer, the term of this patent is extended or adjusted under 35 U.S.C. 154(b) by 169 days.

(21) Appl. No.: 17/227,130

(22) Filed: Apr. 9, 2021

(65) Prior Publication Data
US 2022/0201862 A1 Jun. 23, 2022

(30) Foreign Application Priority Data
Dec. 21, 2020 (TW) ................... 109145285

(51) Int. Cl.
*H05K 1/18* (2006.01)
*H02M 7/00* (2006.01)
*H05K 7/20* (2006.01)

(52) U.S. Cl.
CPC ............ *H05K 1/181* (2013.01); *H02M 7/003* (2013.01); *H05K 7/2039* (2013.01); *H05K 2201/1003* (2013.01)

(58) Field of Classification Search
CPC ............... H05K 1/181; H05K 7/2039; H05K 2201/1003; H05K 1/0263;
(Continued)

(56) References Cited

U.S. PATENT DOCUMENTS

2016/0086718 A1* 3/2016 Tsai ................... H01F 27/324
336/221
2017/0358897 A1* 12/2017 Young ................. H01L 23/46
(Continued)

FOREIGN PATENT DOCUMENTS

CN 202142389 U 2/2012
TW 200952002 A 12/2009

OTHER PUBLICATIONS

Communication corresponding to Taiwan Application No. 109145285 and issued by Taiwan Intellectual Property Office dated Apr. 15, 2021, 11 pages.

*Primary Examiner* — Adam B Dravininkas
(74) *Attorney, Agent, or Firm* — Innovation Counsel LLP (57) ABSTRACT

An assembly structure of a transformer and a circuit board includes: a circuit board, a packaging chip, a transformer, a first conductive plate, a second conductive plate and a first heat sink. The packaging chip is disposed on the circuit board. The transformer has at least one first output electrode and at least one second output electrode connected to the first output electrode. The first conductive plate is disposed on the transformer and connected to the at least one first output electrode. The second conductive plate is disposed on the transformer and connected to the at least one second output electrode and the circuit board. The first heat sink is connected to the packaging chip and the first conductive plate, is disposed on the circuit board, and is connected to the circuit board and the first conductive plate.

20 Claims, 7 Drawing Sheets

(58) Field of Classification Search
CPC .......... H05K 2201/10166; H05K 2201/10272; H05K 7/1432; H05K 7/14329; H02M 7/003
See application file for complete search history.

(56) References Cited

U.S. PATENT DOCUMENTS

2019/0098777 A1* 3/2019 Nakatsu .............. H01L 23/3735
2019/0122806 A1* 4/2019 Chou .................... H05K 1/141
2019/0378645 A1* 12/2019 Chiang .............. H01F 27/2847

* cited by examiner

ASSEMBLY STRUCTURE OF TRANSFORMER AND CIRCUIT BOARD AS WELL AS ASSEMBLY METHOD THEREOF

This application claims the benefit of Taiwan application Serial No. 109145285, filed Dec. 21, 2020, the subject matter of which is incorporated herein by reference.

BACKGROUND

Technical Field

The disclosure relates in general to an assembly structure of a transformer and the assembly method thereof, and more particularly to an assembly structure of a transformer and a circuit board as well as the assembly method thereof.

Description of the Related Art

Transformers are electronic components frequently used in various electrical equipment, which are used to convert external input power into the working voltage required for the operation of the electronic equipment, so that the electronic equipment can operate normally. Traditionally, a transformer is connected to an electronic equipment by directly welding the output terminal of the transformer to a circuit board of the electronic equipment, and the current output by the transformer can be transmitted to the target device of the electronic equipment through the bus bars and metal wires of the circuit board.

A typically transformer is a DC/DC converter generally provides a large current output; and the metal wires of the circuit board are thin-film circuits. In order to withstand the current output by the transformer, the number and thickness of the copper foil for forming the thin-film circuits need to be specially increased. However, this may significantly increase manufacturing costs. In addition, the size of the transformer is difficult to miniaturize, and it is not easy to assemble by directly welding the transformer onto the circuit board. Such that, the yield for fabricating the electrical equipment may be adversely affect.

Therefore, there is a need of providing an assembly structure of a transformer and a circuit board as well as assembly method thereof to overcome the drawbacks of the prior art.

SUMMARY

One aspect of the present disclosure provides an assembly structure of a transformer and a circuit board, wherein the assembly structure includes: a circuit board, a packaging chip, a transformer, a first conductive plate (bus bar), a second conductive plate and a first heat sink. The packaging chip is disposed on the circuit board. The transformer has at least one first output electrode and at least one second output electrode connected to the first output electrode. The first conductive plate is disposed on the transformer and connected to the at least one first output electrode. The second conductive plate is disposed on the transformer and connected to the at least one second output electrode and the circuit board. The first heat sink is connected to the packaging chip and the first conductive plate, is disposed on the circuit board, and is connected to the circuit board and the first conductive plate.

According to aforementioned embodiments of the present disclosure, an assembly structure of a transformer and a circuit board as well as assembly method thereof are provided. A metal heat sink built in a packaging chip disposed on the circuit board in combine with a conductive plate can be used as a conductive wire to connect the output electrode of the transformer and the patterned circuit of the circuit board, so that the larger output current of the transformer can be directly introduced into the target device or the specific circuit connecting the patterned circuit by the metal heat sink without passing through the copper (foil) wire of the circuit board. The number and thickness of copper foil layers that constitute the patterned circuit of the circuit board and the manufacturing cost of the assembly structure can be reduced. In addition, since the connection of the metal heat sink and the conductive plate have a relatively stable structure and can be assembled by simple locking members, it has the technical advantage of simplifying the assembly steps for connecting the transformer and the circuit board and stabilizing the assembly structure.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings.

DETAILED DESCRIPTION

The embodiments of the present disclosure provide an assembly structure of a transformer and a circuit board as well as assembly method thereof to reduce the manufacturing cost of the assembly structure and improve the stability of the assembly structure. The present disclosure will now be described more specifically with reference to the following embodiments illustrating the structure and arrangements thereof.

It should be noted that these embodiments are illustrative and for explanatory purposes only, not for limiting the scope of protection of the invention. The invention can be implemented by using other features, elements, methods and parameters. The preferred embodiments are merely for illustrating the technical features of the disclosure, not for limiting the scope of protection. Anyone skilled in the technology field of the disclosure will be able to make suitable modifications or changes based on the specification disclosed below without breaching the spirit of the disclosure. Designations common to the accompanying drawings are used to indicate identical or similar elements.

Figure 1:
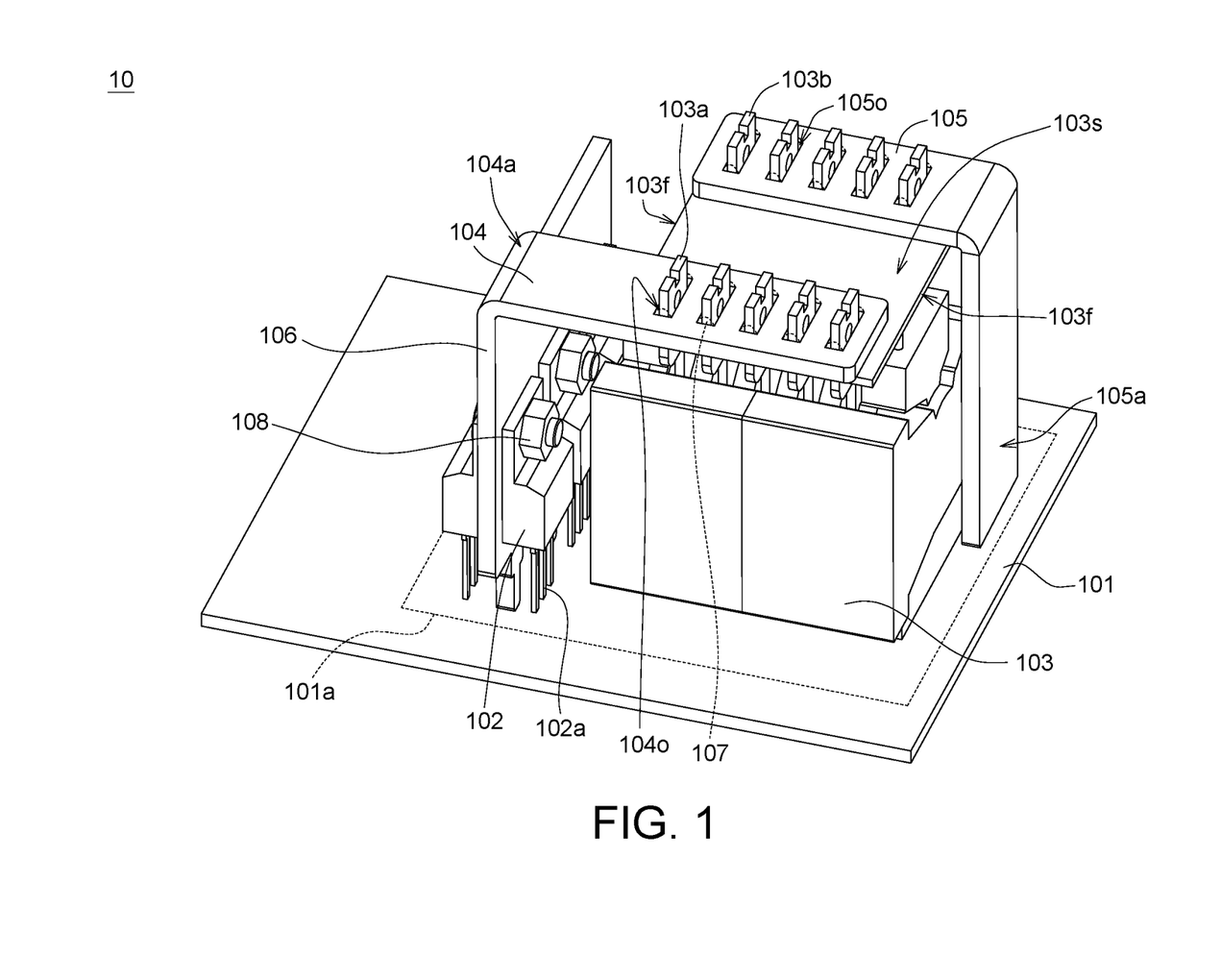
FIG. 1 is a three-dimensional (3D) perspective view illustrating an assembly structure of a transformer and a circuit board according to one embodiment of the present disclosure.

FIG. 1 is a 3D perspective view illustrating an assembly structure 10 of a transformer 103 and a circuit board 101 according to one embodiment of the present disclosure. The assembly structure 10 includes the circuit board 101, a packaging chip 102, the transformer 103, a first conductive plate 104, a second conductive plate 105 and a heat sink 106.

In some embodiments of the present disclosure, the circuit board 101 may be a printed circuit board (PCB) with a variety of pattered circuits 101a for different applications. For example, in the present embodiment, the circuit board 101 may be (but is not limited to) a power supply PCB, which at least includes a power input and output circuit, a rectifier circuit, an amplifier circuit or other circuits used for power supply in an electrical equipment, or the arbitrary combinations of the above circuits.

The packaging chip 102 is disposed on (or fixed on) and contacts with the circuit board 101. In some embodiments of the present disclosure, the packaging chip 102 may be a semiconductor package structure in which one or more semiconductor device and die (not shown) are accommodated, encapsulated, assembled, or encapsulated by a package material (for example, plastic, glass, or ceramic), to provide pins or contacts connected to an external circuit (for example, the patterned circuit 101a of the circuit board 101). In order to remove the heat generated during the operation of the die (not shown), a lead frame or heat sink fins extending outward from the semiconductor package structure are generally used to help remove the heat.

For example, in the present embodiment, the packaging chip 102 may be a rectifier chip, which may be electrically contact with the rectifier circuit (not shown) in the circuit board 101 through a plurality of pins 102a. In addition, the packaging chip 102 further includes a heat sink 106 that is electrically isolated from the semiconductor device and die, in the packaging chip 102 for helping to remove waste heat.

The transformer 103 is a device adopting electromagnetic induction to generate induced electromotive force at both ends of the output. In some embodiments of the present disclosure, the transformer 103 may be (but is not limited to) a single-phase transformer including an output circuit (e.g. a coil winding) composed of at least one ring-shaped conductive sheet (not shown), wherein the ring-shaped conductive sheet include a first output electrode 103a and a second output electrode 103b extending outwards and passing through a top surface 103s of a cover plate of the transformer 103; the first output electrode 103a may serve as a high voltage electrode, and the second output electrode 103b may serve as a ground electrode. In the present embodiment, the transformer 103 is disposed on the circuit board 101, and the top surface 103s of the transformer 103 is disposed on the side away from the circuit board 101.

The first conductive plate 104 is disposed on (or fixed on) the top surface 103s of the transformer 103 and is electrically connected to the first output electrode 103a. The second conductive plate 105 is also disposed on (or fixed on) the top surface 103s of the transformer 103 and is connected to the second output electrode 103b. In the present embodiment, the first conductive plate 104 and the second conductive plate 105 are arranged parallel to each other on the top surface 103s of the transformer 103, and they are electrically isolated from each other. The first conductive plate 104 and the second conductive plate 105 are electrically connected to the first output electrode 103a and the second output electrode 103b by solder 107, respectively.

In detail, the first conductive plate 104 is disposed on the top surface 103s of the transformer 103, and has a plurality of engaging holes 104o used to respectively accommodate the plurality of first output electrodes 103a passing there through and allowing solder 107 filled therein using a furnace brazing process to electrically connect the first conductive plate 104 to the first output electrode 103a. One end 104a of the first conductive plate 104 extends outward from the first conductive plate 104 and beyond the outer edge 103f of the top surface 103s of the transformer 103 to be connected to the heat sink 106.

The second conductive plate 105 is disposed on the top surface 103s of the transformer 103, and has a plurality of engaging holes 105o for accommodating a plurality of second output electrodes 103b passing there through, and allowing solder 107 filled therein using a furnace brazing process to electrically connect the second conductive plate 105 to the second output electrode 103b. One end 105a of the second conductive plate 105 extends outward from the second conductive plate 105, beyond the outer edge 103f of the top surface 103s of the transformer 103, and is bent downward to the circuit board 101, so as to make the second conductive plate 105 electrically connected with the ground end (not shown) of the power input/output circuit in the circuit board 101.

In some embodiments of the present disclosure, the heat sink 106 may be a metal plate or a plate made of other conductive materials, which can be embedded in the encapsulation material of the packaging chip 102 (or connected to the packaging chip 102) and extend outward there from. For example, in the present embodiment, the heat sink 106 can be connected to the surface of the encapsulation structure of the packaging chip 102 by a fastener (such as a bolt/nut) 108, and extends outward beyond the edge of the packaging chip 102 to form an outwardly extending fin or plate.

When the pins 102a of the packaging chip 102 are electrically contact with a rectifier circuit (not shown) in the circuit board 101 through the solder (not shown), one end of the heat sink 106 extends downward to be inserted in and connected to the circuit board 101, whereby the heat sink 106 can be electrically connected to a target device build in a power input and output circuit of the circuit board 101, such as an inductance device (not shown), through the solder (not shown). The other end of the heat sink 106 extends upward to connect to and electrically contact with the first conductive plate 104. In the present embodiment, the heat sink 106 and the first conductive plate 104 can be combined to form an integral metal plate, wherein the first conductive plate 104 can be a bent portion of the heat sink 106.

Since the larger current output from the first output electrode 103a of the transformer 103 can flow directly into the target device build in the circuit board 101 through the connection line formed by the heat sink 106 and the first conductive plate 104, thus it is not necessary to form additional bus bars and copper foil wire layers on the circuit board 101 to transmit this large current. The number of copper foil layers in the circuit board 101 can be reduced, and the manufacturing cost thereof can be reduced.

Figure 2:
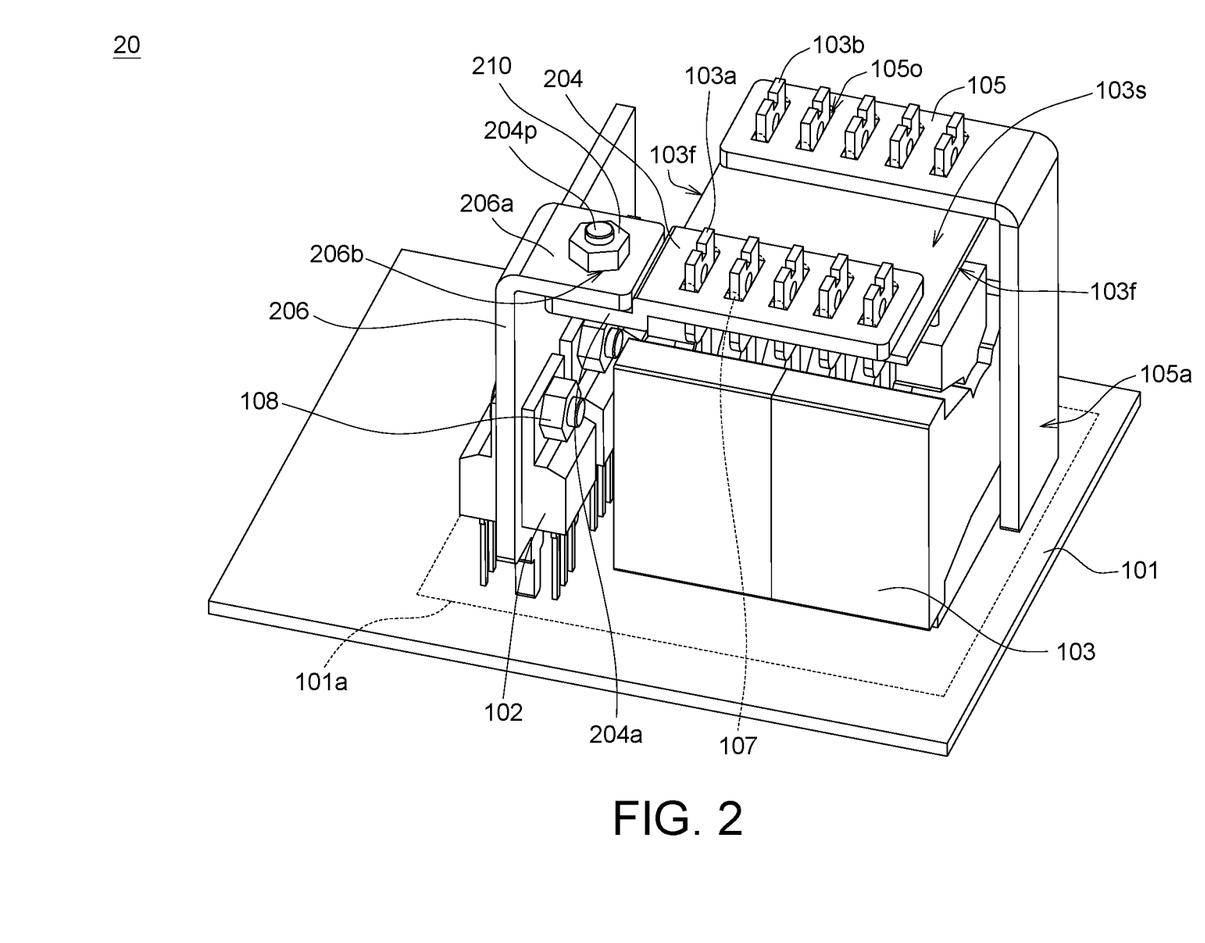
FIG. 2 is a 3D perspective view illustrating an assembly structure of a transformer and a circuit board according to another embodiment of the present disclosure.

However, the connection and arrangement of the heat sink 106 and the first conductive plate 104 are not limited to this regard. FIG. 2 is a 3D perspective view illustrating an assembly structure 20 of a transformer 103 and a circuit board 101 according to another embodiment of the present disclosure. The assembly structure 20 of the transformer 103 and the circuit board 101 is substantially similar to the assembly structure 10. The main difference thereof is that the heat sink 206 and the first conductive plate 204 both build in the assembly structure 20 are not combined to form an integral metal plate, and these two are instead connected to and electrically contact with each other by a locking member 210.

In the present embodiment, the locking member 210 may include at least one screw rod 204*p* protruding from an end 204*a* of the first conductive plate 204 which extends outwardly beyond the outer edge 103*f* of the top surface 103*s* of the transformer 103. The heat sink 206 extends upward adjacent to one end of the first conductive plate 204, and has a bent portion 206*a* that includes at least one through hole 206*b* corresponding to the screw rod 204*p* and allowing the screw rod 204*p* penetrating there through. The locking member 210 can include a nut used to screw-locked on the screw rod 204*p*, by which the end 204*a* of the first conductive plate 204 and the bent portion 206*a* of the heat sink 206 can be closely contact with each other.

Figure 3A:
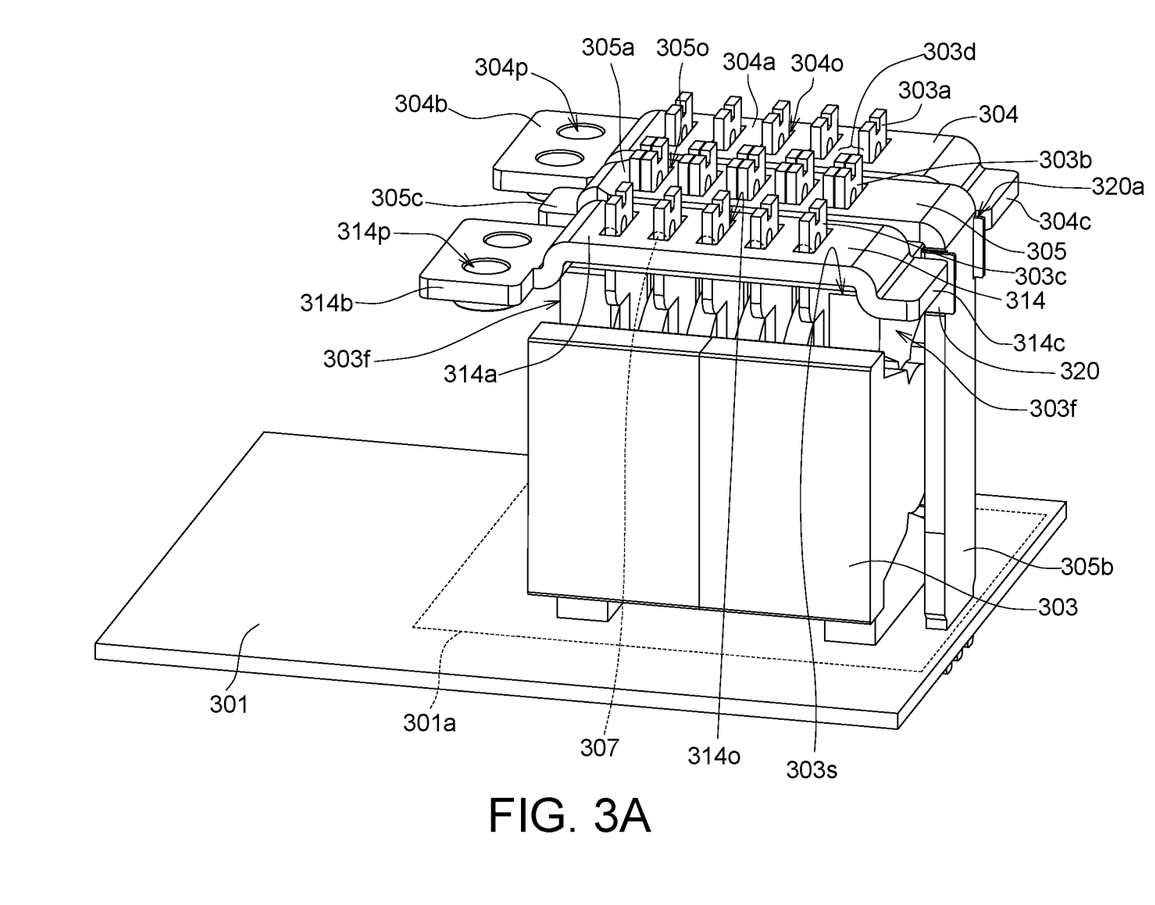
FIGS. 3A and 3B are 3D perspective views illustrating an assembly structure of a transformer and a circuit board according to yet another embodiment of the present disclosure.
Figure 3B:
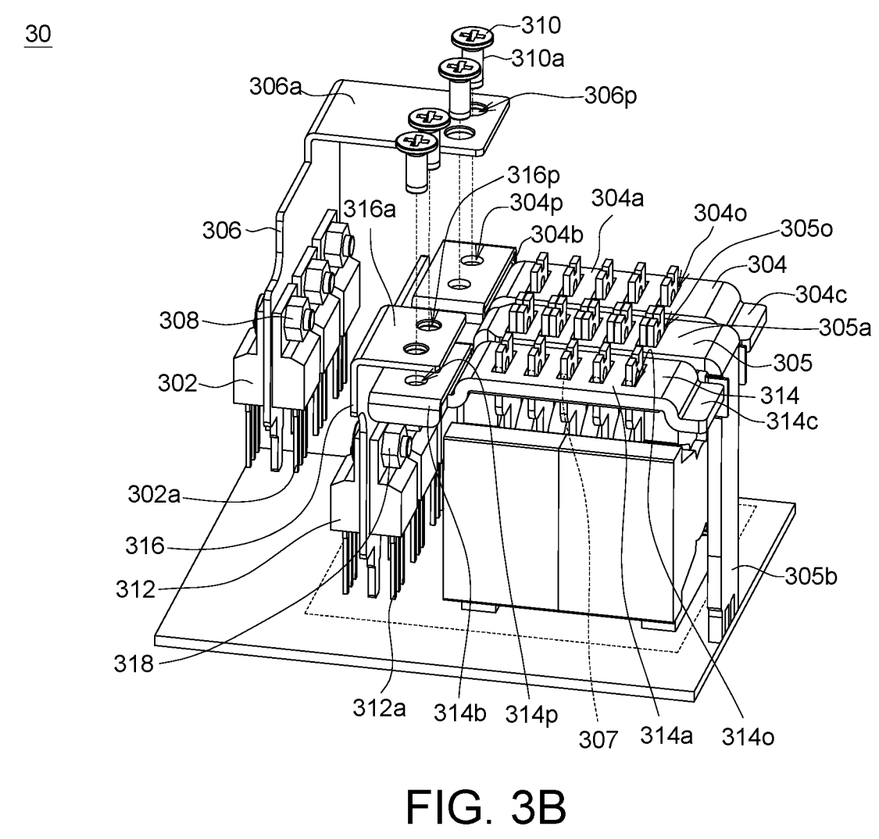

FIGS. 3A and 3B are 3D perspective views illustrating an assembly structure 30 of a transformer 303 and a circuit board 301 according to yet another embodiment of the present disclosure. The assembly structure 30 of the transformer 303 and the circuit board 301 is substantially similar to the assembly structure 20. The main difference thereof is that the transformer 303 can be a three-phase transformer including a positive secondary winding coil and a negative secondary winding coil connected in parallel with each other.

In the present embodiment, the output terminal of the transformer 303 includes a positive secondary winding coil and a negative secondary winding coil, which are respectively composed of a plurality of annular conductive sheets (not shown). Each of the annular conductive sheets of the positive secondary winding coil includes two ends respectively serving a first output electrode 303*a* and a second output electrode 303*b*; each of the annular conductive sheets of the negative secondary winding coil includes two ends respectively serving a third output electrode 303*c* and a second output electrode 303*b*; and two adjacent second output electrodes 303*b* respectively belonging to the positive secondary winding coil and the negative secondary winding coil are connected in series with each other to form a neutral ground electrode 303*d*. The first output electrode 303*a*, the neutral ground electrode 303*d* and the third output electrode 303*c* all extend and protrude upwards beyond a top surface 303*s* of the transformer 303.

The assembly structure 30 of the transformer 303 and the circuit board 301 includes a third conductive plate 314 in addition to the aforementioned first conductive plate 304 and the second conductive plate 305. As shown in FIG. 3A, the first conductive plate 304, the second conductive plate 305, and the third conductive plate 314 are arranged parallel to each other on the top surface 303*s* of the transformer 303, and the three are electrically isolated from each other. The first conductive plate 304, the second conductive plate 305, and the third conductive plate 314 are electrically connected to the first output electrode 303*a*, the second output electrode 303*b* (neutral ground electrode 303*d*) and the third output electrode 303*c* respectively by the solder 307.

In the present embodiment, the first conductive plate 304 includes a first body portion 304*a*, a first end 304*b*, and a second end 304*c*. The first body portion 304*a* is arranged on the top surface 303*s* of the transformer 303, and has a plurality of engaging holes 304*o* for respectively accommodating one of plural first output electrodes 303*a* passing there through and allowing solder 307 filled therein using a furnace brazing process to electrically connect the first body portion 304*a* to the first output electrode 303*a*. The first end 304*b* extends outward from one end of the first body portion 304*a* and beyond an outer edge 303*f* on one side of the top surface 303*s* of the transformer 303, and is bent downwards to a position below the top surface 303*s*. The second end 304*c* extends outward from another end of the first body portion 304*a* and beyond another outer edge 303*f* on the opposite side of the top surface 303*s* of the transformer 303, and is bent downwards to a position below the top surface 303*s*.

The second conductive plate 305 includes a second body portion 305*a*, a third end 305*b*, and a fourth end 305*c*. The second body portion 305*a* is arranged on the top surface 303*s* of the transformer 303, and has a plurality of engaging holes 305*o* for respectively accommodating one of plural second output electrodes 303*b* passing there through and allowing solder 307 filled therein using a furnace brazing process to electrically connect the second body portion 305*a* to the second output electrodes 303*b*. The third end 305*b* extends outward from one end of the second body portion 305*a* and beyond the outer edge 303*f* on one side of the top surface 303*s* of the transformer 303, and is bent downwards to the circuit board 301, so as to make the second conductive plate 305 electrically connected with the ground end (not shown) of the power input/output circuit in the circuit board 301. The fourth end 305*c* extends outward from another end of the second body portion 305*a* and beyond the outer edge 303*f* on the opposite side of the top surface 303*s* of the transformer 303, and is bent downwards to a position below the top surface 303*s*.

The third conductive plate 314 includes a third body portion 314*a*, a fifth end 314*b*, and a sixth end 314*c*. The third body portion 314*a* is arranged on the top surface 303*s* of the transformer 303, and has a plurality of engaging holes 314*o* for respectively accommodating one of plural third output electrodes 303*c* passing there through and allowing solder 307 filled therein using a furnace brazing process to electrically connect the third body portion 314*a* to the third output electrodes 303*c*. The fifth end 314*b* extends outward from one end of the third body portion 314*a* and beyond the outer edge 303*f* on one side of the top surface 303*s* of the transformer 303, and is bent downwards to a position below the top surface 303*s*. The sixth end 314*c* extends outward from another end of the third body portion 314*a* and beyond the outer edge 303*f* on the opposite side of the top surface 303*s* of the transformer 303, and is bent downwards to a position below the top surface 303*s*.

Wherein, the first end 304*b* of the first conductive plate 304, the fourth end 305*c* of the second conductive plate 305, and the fifth end 314*b* of the third conductive plate 314 are disposed on the same side of the transformer 303; the second end 304*c* of the first conductive plate 304, the second conductive plate 305 of the third end 305*b* and the sixth end 314*c* of the third conductive plate 314 are disposed on the other side of the transformer 303. In the present embodiment, bending the first end 304*b*, the second end 304*c*, the fourth end 305*c*, the fifth end 314*b* and the six end 314*c* of the first conductive plate 304, the second conductive plate 305 and the third conductive plate 314 downward to male them extend to positions below the top surface 303*s* is for the purpose of cooperating with the soldering process of the solder 307.

In detail, during the furnace brazing process, each end of the first conductive plate 304, the second conductive plate 305, and the third conductive plate 314 placed on the top surface 303*s* of the transformer 303 should be engaged with a special tool (not shown) to make the first body portion 304*a*, the second body portion 305*a* and the third body portion 314a of the first conductive plate 304, the second conductive plate 305 and the third conductive plate 314 being further inserted into the brazing furnace (not shown).

Since the third end 305b of the second body portion 305a extends outward beyond the outer edge 303f of the top surface 303s of the transformer 303, and is bent downwards to the circuit board 301, so as to make the second conductive plate 305 electrically connected with the ground end (not shown) of the power input/output circuit in circuit board 301, thus it is impossible to form a groove for engaging the tool (not shown). Therefore, in some embodiments of the present disclosure, a supporting member 320 may be provided to fix on the second body portion 305a or the third end 305b and serving as a clamping groove of the tool (not shown), wherein the top plane 320a of the support member 320 may be substantially coplanar with the top planes of the first end 304b, the second end 304c, the fourth end 305c, the fifth end 314b and the sixth end 314c.

The supporting member 320 may be an additional connecting member, such as a metal or ceramic frame, connected to the second body portion 305a or the third end 305b. For example, in the present embodiment, the supporting member 320 may be a metal frame connected to the second body portion 305a. It can be electrically isolated from the first conductive plate 304 and the third conductive plate 314, and has two flanges that can be bent backward on both sides of the third end 305b. In other embodiments, the supporting member 320 may be two protrusions extending from two opposite sides of the third end 305b of the second conductive plate 305 and integrally formed with the third end 305b.

As shown in FIG. 3B (further referencing to FIG. 3A), the first end 304b of the first conductive plate 304 is connected to the heat sink 306; the fifth end 314b of the third conductive plate 314 is connected to the heat sink 316. The heat sinks 306 and 316 are respectively connected to the packaging chips 302 and 312, are electrically connected to the circuit board 301, respectively. In the present embodiment, the heat sinks 306 and 316 are both metal plates, which are connected to the surface of the encapsulation structure of the packaging chips 302 and 312 by locking members (such as bolts/nuts) 308 and 318, respectively, and extend outwards to respectively connect to the first end 304b of the first conductive plate 304 and the fifth end 314b of the third conductive plate 314.

In detail, when the pins 302a and 312a of the packaging chips 302 and 312 are respectively in electrical contact with the rectifier circuit in the circuit board 301 through solder (not shown), the heat sinks 306 and 312 respectively have one end extending downward to be inserted in and disposed on (or fixed on) the circuit board 301, whereby the heat sinks 306 and 312 can be electrically connected to the target devices build in a power input and output circuit of the circuit board 301, such as an inductance device (not shown), through the solder (not shown). The other ends of the heat sinks 306 and 312 respectively extend upward, and respectively have a bent portion 306a and 316a partially overlapping with the first end 304b of the first conductive plate 304 and the fifth end 314b of the third conductive plate 314.

The first end 304b of the first conductive plate 304 and the fifth end 314b of the third conductive plate 314 may respectively include a plurality of screw holes 304p and 314p, each of which corresponds to one of the bent portions 306a and 316a of the heat sinks 306 and 312. A bolt 310 can be used as the locking member, by which a threaded rod 310a of a bolt 310 is inserted into the screw holes 304p and 306p of the first end 304b and the bent portion 306a, so that the first end 304b of the first conductive plate 304 and the bent portions 306a of the heat sink 306 can be closely contact with each other. Another threaded rod 310a of another bolt 310 is inserted into the screw holes 304p and 306p of the fifth end 314b and the bent portion 316a, so that the fifth end 314b of the third conductive plate 314 and the bent portions 316a of the heat sink 316 can be closely contact with each other.

Since the larger current output from the first output electrode 303a and the third output electrode 303c of the transformer 303 can flow directly into the target device build in the circuit board 301 through the connection line formed by the heat sink 306 and the first conductive plate 304 as well as the line formed by the heat sink 316 and the third conductive plate 314, thus it is not necessary to form additional bus bars and copper foil wire layers on the circuit board 301 to transmit this large current. The number of copper foil layers in the circuit board 301 can be reduced, and the manufacturing cost thereof can be reduced.

It should be appreciated that although the first conductive plate 304 and the third conductive plate 314, as shown in FIG. 3, are respectively connected to different heat sinks 306 and 316 belonging to different packaging chips 302 and 312, but the connection between the conductive plates and the heat sinks may not be limited to this regard. In some other embodiments, the first conductive plate 304 and the third conductive plate 314 may be connected to the same heat sink 306 of belonging to the same packaging chip 302 (not shown).

Figure 4:
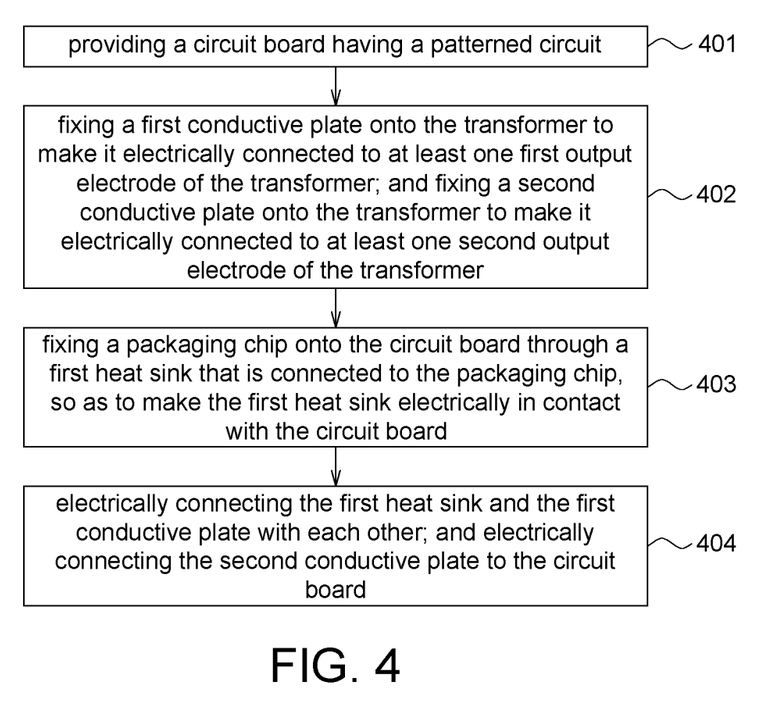
FIG. 4 is a flow chart illustrating the steps for assembling the assembly structure of the transformer and the circuit board according to one embodiment of the present disclosure.

FIG. 4 is a flow chart illustrating the steps for assembling the assembly structure 30 of the transformer 303 and the circuit board 301 according to one embodiment of the present disclosure. The method for assembling an assembly structure 30 includes steps as follows: Firstly, the circuit board 301 having the patterned circuit 301a is provided (refer to step 401). Next, refer to step 402, the transformer 303 is paced on the circuit board 301, and the first conductive plate 304, the second conductive plate 305, and the third conductive plate 314 are disposed on (or fixed on) the transformer 303, so that the first conductive plate 304 can be electrically connected to at least one of the first output electrode 303a of the transformer 303; the second conductive plate 305 can be electrically connected to at least one second output electrode 303b of the transformer 303; and the third conductive plate 314 can be electrically connected to at least one third output electrode 303c of the transformer 303 (as shown in FIG. 3A).

Subsequently, refer to step 403, the package chips 302 and 312 are disposed on (or fixed on) the circuit board 301 through the heat sinks 306 and 316 connected to the packaging chips 302 and 312, and the heat sinks 306 and 316 of the packaging chips 302 and 312 are in electrical contact with the circuit board 301, respectively. In step 404, the locking members (the bolts 310) are used to respectively connect and electrically contact the heat sink 302 with the first conductive plate 304 as well as connect and electrically contact the heat fin 316 with the third conductive plate 304. In step 405, the second conductive plate 305 is electrically connected to the circuit board 301, so as to complete the assembly of the assembly structure 30 as shown in FIG. 3B.

Figure 5:
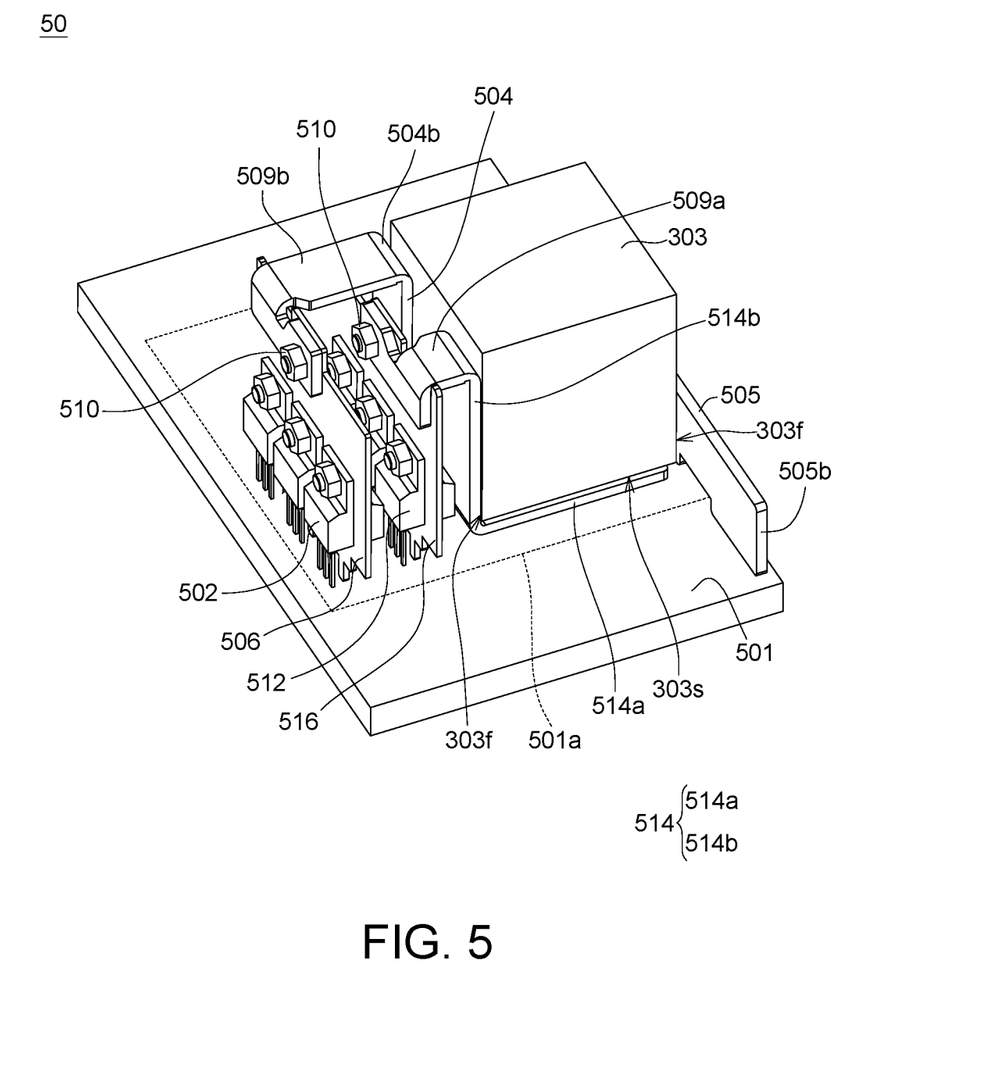
FIG. 5 is a 3D perspective view illustrating an assembly structure of a transformer and a circuit board according to further embodiment of the present disclosure.

However, the structure of the assembly structure of the present disclosure may not be not limited to these regards. FIG. 5 is a 3D perspective view illustrating an assembly structure 50 of a transformer and a circuit board according to further embodiment of the present disclosure. The assembly structure 50 is substantially similar to the assembly structure 30. The main difference thereof lies in the position arrangement of the transformer 303 in the assembly structure 50, as well as the different shapes and connections of the first conductive plate 504, the second conductive plate 505 and the third conductive plate 514.

In the present embodiment, the transformer 303 is disposed on the circuit board 501 to make the top surface 303s of the transformer 303 facing the patterned circuit 501a of the circuit board 501. The first conductive plate 504, the second conductive plate 505, and the third conductive plate 514 respectively have a body portion (only the body portion 514a of the third conductive plate 514 is shown in FIG. 5) and an end (such as, a first end 504b, fourth end 505b, and fifth end 514b respectively corresponding to the first conductive plate 504, the second conductive plate 505, and the third conductive plate 514) extending outward from the body portion. The body portions of the first conductive plate 504, the second conductive plate 505, and the third conductive plate 514 are electrically connected to the first output electrode 303a, the second output electrode 303b (the neutral ground electrode 303d) and the third output electrode 303c of the transformer 303 (not shown in FIG. 5).

Wherein, the first end 504b of the first conductive plate 504 and the fifth end 514b of the third conductive plate 514 extend outward beyond the outer edge 303f of the top surface 303s of the transformer 303, and then are bent upwards away from the circuit board 501. The fourth end 505b of the second conductive plate 505 is disposed on the opposite side of the transformer 303 away from the first end 504b and the fifth end 514b, and extends outwards beyond the other outer edge 303f of the top surface 303s of the transformer 303 along a direction parallel to the circuit board 501 to make the fourth end 505b electrically connected to the ground end (not shown) of the power input/output circuit in the circuit board 501.

The first end 504b of the first conductive plate 504 and the fifth end 514b of the third conductive plate 514 are respectively connected to the heat sinks 506 and 516 that are respectively connected to the package chips 502 and 512, through a connecting bridge 509a and 509b. In the present embodiment, the first end 504b of the first conductive plate 504 and the fifth end 514b of the third conductive plate 514 are disposed on the same side of the transformer 303; the bodies of the heat sinks 506 and 516 are respectively connected to the packaging chips 502 and 512. Each of the heat sinks 506 and 516 has one end connected to the circuit board 501 and the other end extending upwards and respectively close to the first end 504b of the first conductive plate 504 and the fifth end 514b of the third conductive plate 514. The connecting bridges 509a and 509b are respectively a portion of the first end 504b of the first conductive plate 504 and the fifth end 514b of the third conductive plate 514 that are bent outward and are connected to the heat sink 506 and 516 by locking members (such as, bolt/nut) 510 respectively.

It should be appreciated that although the connecting bridges 509a and 509b, shown in FIG. 5, are respectively portions of the first conductive plate 504 and the third conductive plate 514 that are bent outward, in other embodiments, the connecting bridge 509a and 509b can be two plates that are respectively independent from the first conductive plate 504 and the third conductive plate 514. In addition, the detailed structure of the locking members 510, the assembling direction and the materials used to make thereof are not limited. Any joining elements, structure, or material that facilitates the connection and electrical contact between the first conductive plate 504 and the third conductive plate 514 and the heat sink 506 and 516 does not depart from the spirit and scope of the present disclosure.

Figure 6:
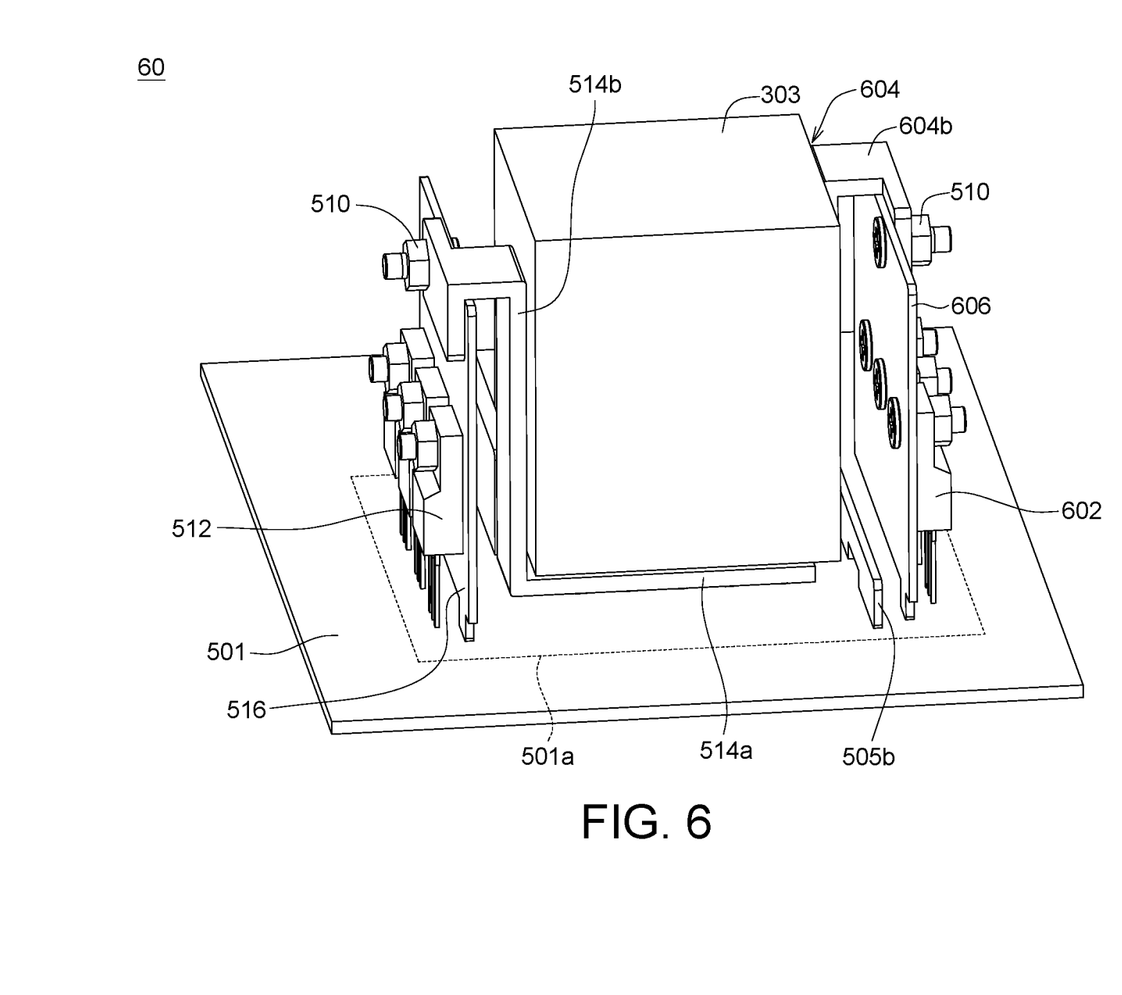
FIG. 6 is a 3D perspective view illustrating an assembly structure of a transformer and a circuit board according to further another embodiment of the present disclosure.

FIG. 6 is a 3D perspective view illustrating an assembly structure 60 of a transformer 303 and a circuit board 501 according to further another embodiment of the present disclosure. The assembly structure 60 is substantially similar to the assembly structure 50 as depicted in FIG. 5. The main difference thereof lies in the connection of the first conductive plate 604 and the heat sink 606 built in the assembly structure 60.

In the present embodiment, the first end 604b of the first conductive plate 604 and the fifth end 514b of the third conductive plate 514 are respectively disposed on opposite sides of the transformer 303; the bodies of the heat sinks 606 and 512 are connected to the packaging chips 602 and 516, respectively. Each of the heat sinks 606 and 512 has one end disposed on (or fixed on) the circuit board 501, and the other ends of the two respectively extend upward close to the first end 604b of the first conductive plate 604 and the fifth end 514b of the third conductive plate 514. The first end 604b of the first conductive plate 604 and the fifth end 514b of the third conductive plate 514 are connected to the heat sink 606 and 516 by a fastener (such as, a bolt/nut) 510.

According to aforementioned embodiments of the present disclosure, an assembly structure of a transformer and a circuit board as well as assembly method thereof are provided. A metal heat sink built in a packaging chip disposed on the circuit board in combine with a conductive plate can be used as a conductive wire to connect the output electrode of the transformer and the patterned circuit of the circuit board, so that the larger output current of the transformer can be directly introduced into the target device or the specific circuit connecting the patterned circuit by the metal heat sink without passing through the copper (foil) wire of the circuit board. The number and thickness of copper foil layers that constitute the patterned circuit of the circuit board and the manufacturing cost of the assembly structure can be reduced. In addition, since the connection of the metal heat sink and the conductive plate have a relatively stable structure and can be assembled by simple locking members, it has the technical advantage of simplifying the assembly steps for connecting the transformer and the circuit board and stabilizing the assembly structure.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An assembly structure of a transformer and a circuit board, comprising:
  a circuit board;
  a packaging chip, disposed on the circuit board;
  a transformer, having at least one first output electrode and at least one second output electrode connected to the first output electrode;
  a first conductive plate, disposed on the transformer and connected to the at least one first output electrode;
  a second conductive plate, disposed on the transformer and connected to the at least one second output electrode and the circuit board; and
  a first heat sink, connected to the packaging chip and the first conductive plate, disposed on the circuit board, and connected to the circuit board and the first conductive plate;

wherein one end of the first heat sink extends downward to be inserted in and connected to the circuit board, the packaging chip is attached to the first heat sink, an extending direction of the packaging chip and the first heat sink is substantially perpendicular to the circuit board.

2. The assembly structure according to claim 1, wherein the circuit board electrically contacts to the second conductive plate and the packaging chip.

3. The assembly structure according to claim 2, wherein the packaged chip is a rectifier chip electrically contacting to the circuit board through a plurality of pins and electrically isolated from the first heat sink.

4. The assembly structure according to claim 2, further comprising:
   at least one third output electrode, wherein the at least one first output electrode and the at least one third output electrode are respectively connected to a portion of the at least one second output electrode, and are connected in parallel with each other; and
   a third conductive plate, disposed on the transformer and connected to the at least one third output electrode; and
   a third heat sink, connected to the third conductive plate and the packaging chip or connected to the third conductive plate and another packaging chip, and disposed on the circuit board, and connected to the circuit board and the third conductive plate.

5. The assembly structure according to claim 2, wherein the first conductive plate comprises:
   a first body portion, arranged on a top surface of the transformer, and connected to the at least one first output electrodes;
   a first end, extending outward from the first body portion and beyond the outer edge, and connected to the first heat sink; and
   a second end, extending outward from one side of the first body portion opposite to the first end and beyond the outer edge.

6. The assembly structure according to claim 5, wherein the first body portion is connected to the at least one first output electrodes by a solder.

7. The assembly structure according to claim 5, wherein the first end is bent downwards to a position below the top surface.

8. The assembly structure according to claim 5, wherein the second end is bent downwards to a position below the top surface.

9. The assembly structure according to claim 5, wherein the second conductive plate comprises:
   a second body portion, arranged on the top surface of the transformer, and connected to the at least one second output electrodes;
   a third end, extending outward from the second body portion and beyond the outer edge, and connected with the circuit board; and
   a fourth end, extending outward from one side of the second body portion opposite to the third end and beyond the outer edge.

10. The assembly structure according to claim 9, wherein the second body portion is connected to the at least one second output electrodes by a solder.

11. The assembly structure according to claim 9, wherein the third end is bent downwards to be connected with the circuit board.

12. The assembly structure according to claim 9, wherein the fourth end is bent downwards to a position below the top surface.

13. The assembly structure according to claim 9, further comprising a supporting member disposed on the third end, wherein a top plane of the support member is coplanar with top planes of the first end, the second end and the fourth end.

14. The assembly structure according to claim 13, wherein the supporting member is either an additional connecting member connected to the second body portion or at least one protrusion extending from the third end.

15. The assembly structure according to claim 5, wherein the transformer is disposed on the circuit board, and the top surface is disposed on one side of the transformer away from the circuit board.

16. The assembly structure according to claim 5, wherein the transformer is disposed on the circuit board, and the top surface is disposed on one side of the transformer facing the circuit board.

17. The assembly structure according to claim 1, wherein the first conductive plate and the first heat sink are connected to each other by a locking member, and the locking member comprises:
   a screw rod protruding from one of the first conductive plate and the first heat sink and passing through the other one of the first conductive plate and the first heat; and
   a nut, used to screw-locked on the screw rod, by which the first conductive plate and the heat sink closely contact with each other.

18. The assembly structure according to claim 5, wherein the first conductive plate and the first heat sink are connected to each other by a bolt, and the locking member comprises a threaded rod inserted into a first screw hole of the first conductive plate and a second screw hole of the first heat sink to make the first conductive plate and the first heat sink closely contact with each other.

19. The assembly structure according to claim 18, wherein the first heat sink has a bent portion partially overlapping with the first conductive plate, the first screw hole is disposed in the first end and the second screw hole is disposed in the bent portion to make the first conductive plate and the first heat sink closely contact with each other.

20. The assembly structure according to claim 1, wherein heat sink and the first conductive plate are combined to form an integral metal plate.

* * * * *